(12) United States Patent
Kitada

(10) Patent No.: US 12,053,986 B2
(45) Date of Patent: Aug. 6, 2024

(54) PIEZOELECTRIC ELEMENT, LIQUID EJECTION HEAD, AND LIQUID EJECTION APPARATUS

(71) Applicant: SEIKO EPSON CORPORATION, Tokyo (JP)

(72) Inventor: Kazuya Kitada, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 40 days.

(21) Appl. No.: 17/321,778

(22) Filed: May 17, 2021

(65) Prior Publication Data
US 2021/0362500 A1  Nov. 25, 2021

(30) Foreign Application Priority Data
May 20, 2020  (JP) .................. 2020-088038

(51) Int. Cl.
| | |
|---|---|
| *B41J 2/14* | (2006.01) |
| *H10N 30/00* | (2023.01) |
| *H10N 30/073* | (2023.01) |
| *H10N 30/80* | (2023.01) |
| *H10N 30/853* | (2023.01) |
| *H10N 30/87* | (2023.01) |

(52) U.S. Cl.
CPC ........ *B41J 2/14233* (2013.01); *H10N 30/073* (2023.02); *H10N 30/10516* (2023.02); *H10N 30/802* (2023.02); *H10N 30/8554* (2023.02); *H10N 30/871* (2023.02); *B41J 2202/03* (2013.01)

(58) Field of Classification Search
None
See application file for complete search history.

(56) References Cited

U.S. PATENT DOCUMENTS

| | | | |
|---|---|---|---|
| 8,803,264 B1* | 8/2014 | Katiyar | H01L 29/516 |
| | | | 257/421 |
| 2006/0051913 A1* | 3/2006 | Murai | B41J 2/1623 |
| | | | 438/197 |
| 2014/0210915 A1* | 7/2014 | Isshiki | H01L 41/0973 |
| | | | 310/357 |
| 2017/0040523 A1 | 2/2017 | Sakai | |
| 2018/0175277 A1* | 6/2018 | Kitada | B41J 2/14201 |

FOREIGN PATENT DOCUMENTS

| | | |
|---|---|---|
| JP | H09052763 A | 2/1997 |
| JP | 2004-066600 A | 3/2004 |
| JP | 2017037932 A | 2/2017 |
| WO | 2016-20395 A | 11/2016 |

* cited by examiner

*Primary Examiner* — Erica S Lin
(74) *Attorney, Agent, or Firm* — WORKMAN NYDEGGER

(57) ABSTRACT

A piezoelectric element includes a substrate and a laminate which is provided on the substrate and which includes a first electrode, a seed layer, a piezoelectric layer, and a second electrode in this order, and the seed layer includes a composite oxide containing as a constituent element, lead, iron, and titanium.

18 Claims, 13 Drawing Sheets

PIEZOELECTRIC ELEMENT, LIQUID EJECTION HEAD, AND LIQUID EJECTION APPARATUS

The present application is based on, and claims priority from JP Application Serial Number 2020-088038, filed May 20, 2020, the disclosure of which is hereby incorporated by reference herein in its entirety.

BACKGROUND

1. Technical Field

The present disclosure relates to a piezoelectric element, a liquid ejection head, and a liquid ejection apparatus.

2. Related Art

A piezoelectric element which is used for a piezoelectric type ink jet printer and which has a laminate structure formed by film formation has been known. For example, in a piezoelectric element disclosed in JP-A-2004-66600, a lower electrode film, a piezoelectric layer, and an upper electrode film are laminated in this order. In the above patent document, an entire surface of the lower electrode film at a piezoelectric layer side is formed from an orientation control layer of lanthanum nickelate. A crystal plane orientation of the orientation control layer is preferentially oriented in the (100) direction. When the piezoelectric layer is formed, a crystal plane orientation thereof is oriented in the (100) by the influence of the plane orientation of the orientation control layer.

In the piezoelectric element disclosed in JP-A-2004-66600, for example, in association with the use of the piezoelectric element, lanthanum or nickel in the orientation control layer is diffused to the piezoelectric layer with time, and as a result, the piezoelectric characteristics may be disadvantageously degraded in some cases.

SUMMARY

According to an aspect of the present disclosure, there is provided a piezoelectric element comprising: a substrate; and a laminate which is provided on the substrate and which includes a first electrode, a seed layer, a piezoelectric layer, and a second electrode in this order, and the seed layer includes a composite oxide containing as a constituent element, lead, iron, and titanium.

According to another aspect of the present disclosure, there is provided a liquid ejection head comprising: the piezoelectric element according to the aspect described above; and a drive circuit to drive the piezoelectric element.

According to another aspect of the present disclosure, there is provided a liquid ejection apparatus comprising: the liquid ejection head according to the aspect described above; and a control portion which controls an operation of the liquid ejection head.

DESCRIPTION OF EXEMPLARY EMBODIMENTS

Figure 1:
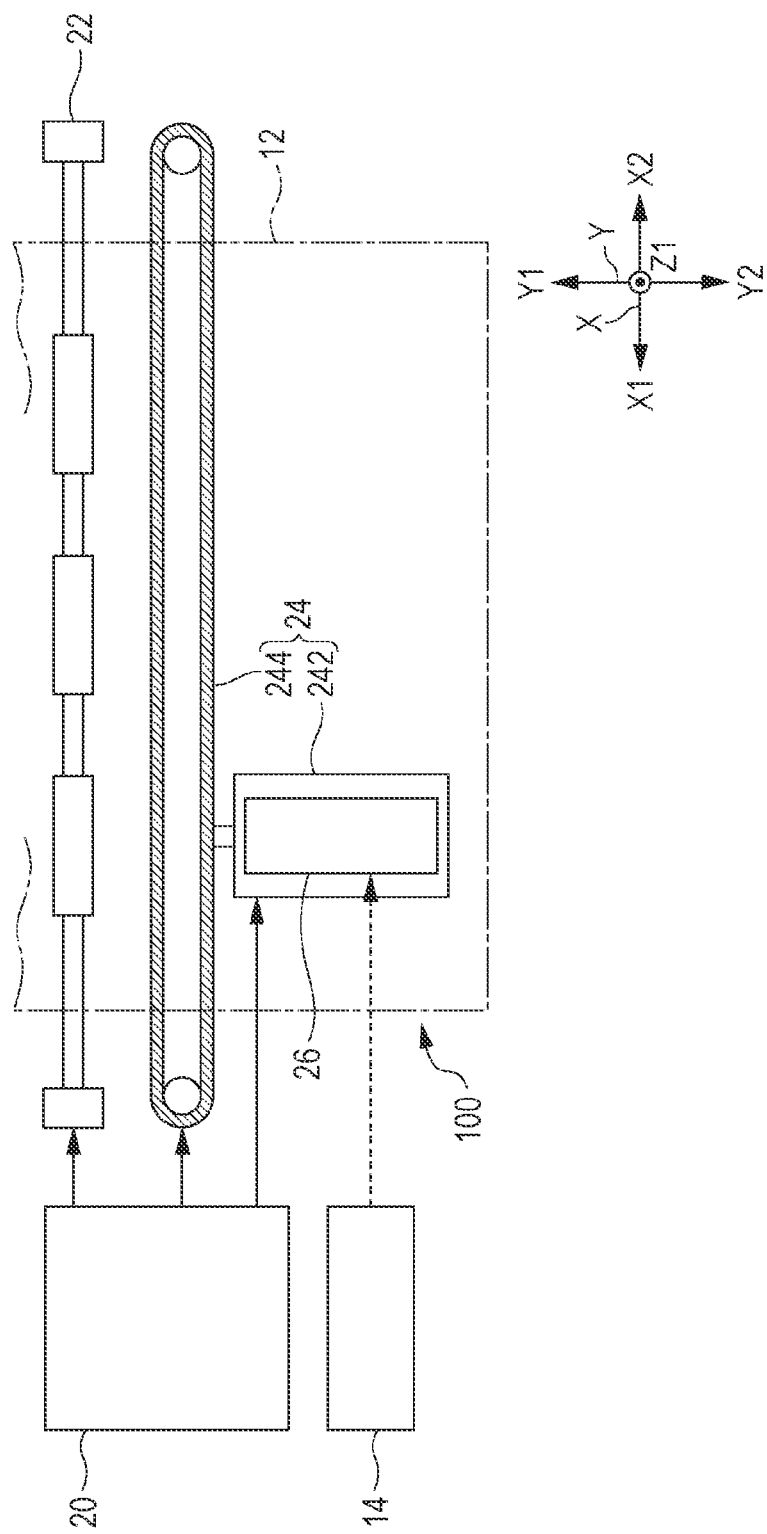
FIG. 1 is a schematic structural view of a liquid ejection apparatus according to an embodiment.

Hereinafter, with reference to the attached drawings, a preferable embodiment according to the present disclosure will be described. In addition, the dimensions and the scales of portions shown in the drawings are appropriately changed from the actual values, and to facilitate understanding of the present disclosure, some portions are schematically shown in some cases. In addition, the scope of the present disclosure is not limited to those described below unless otherwise particularly noted.

In addition, the following description will be performed appropriately using an X axis, a Y axis, and a Z axis which intersect with each other. In addition, one direction along the X axis is called an X1 direction, and a direction opposite to the X1 direction is called an X2 direction. As is the case described above, directions along the Y axis opposite to each other are called a Y1 direction and a Y2 direction. In addition, directions along the Z axis opposite to each other are called a Z1 direction and a Z2 direction. To view in the direction along the Z axis is called "in plan view".

In addition, in general, the Z axis is a vertical axis, and the Z2 direction corresponds to a downward direction along the vertical direction. However, the Z axis is not always required to be the vertical direction. In general, although being orthogonal to each other, the X axis, the Y axis, and the Z axis are not limited thereto, and for example, those axes may intersect with each other within an angle of 80° to 100°.

1. Embodiment 1-1. Total Structure of Liquid Ejection Apparatus

FIG. 1 is a schematic structural view of a liquid ejection apparatus 100 according to an embodiment. The liquid ejection apparatus 100 is an ink jet type printing apparatus which ejects ink droplets, that is, one example of a liquid, to a medium 12. The medium 12 is typically printing paper. In addition, the medium 12 is not limited to printing paper and for example, may be a printing object, such as a resin film or a cloth, formed from an arbitrary material.

As shown in FIG. 1, to the liquid ejection apparatus 100, a liquid container 14 which stores an ink is fitted. As a particular mode of the liquid container 14, for example, a cartridge detachable to the liquid ejection apparatus 100, a bag-shaped ink pack formed from a flexible film, or an ink tank into which the ink can be replenished may be mentioned. In addition, the type of ink to be stored in the liquid container 14 may be arbitrarily selected.

The liquid ejection apparatus 100 includes a control unit 20, a transport mechanism 22, a transfer mechanism 24, and a liquid ejection head 26. The control unit 20 includes a processing circuit, such as a central processing unit (CPU) or a field programmable gate array (FPGA), and a memory circuit such as a semiconductor memory and controls operations of elements of the liquid ejection apparatus 100. In this liquid ejection apparatus 100, the control unit 20 is one example of a "control portion" and controls an operation of the liquid ejection head 26.

The transport mechanism 22 transports the medium 12 in the Y2 direction under the control by the control unit 20. The transfer mechanism 24 reciprocally transfers the liquid ejection head 26 in the X1 direction and the X2 direction under the control by the control unit 20. In the example shown in FIG. 1, the transfer mechanism 24 includes an approximately box-shaped transport body 242, which is a so-called carriage, to receive the liquid ejection head 26 and a transport belt 244 to which the transport body 242 is fixed. In addition, the number of the liquid ejection heads 26 mounted in the transport body 242 is not limited to one and may be at least two. In addition, in the transport body 242, besides the liquid ejection head 26, the liquid container 14 described above may also be mounted.

Under the control by the control unit 20, the liquid ejection head 26 ejects the ink to be supplied from the liquid container 14 from nozzles to the medium 12 in the Z2 direction. Since this ejection is performed in parallel with the transport of the medium 12 by the transport mechanism 22 and the reciprocation of the liquid ejection head 26 by the transfer mechanism 24, on a surface of the medium 12, an image of the ink is formed.

1-2. Total Structure of Liquid Ejection Head

Figure 2:
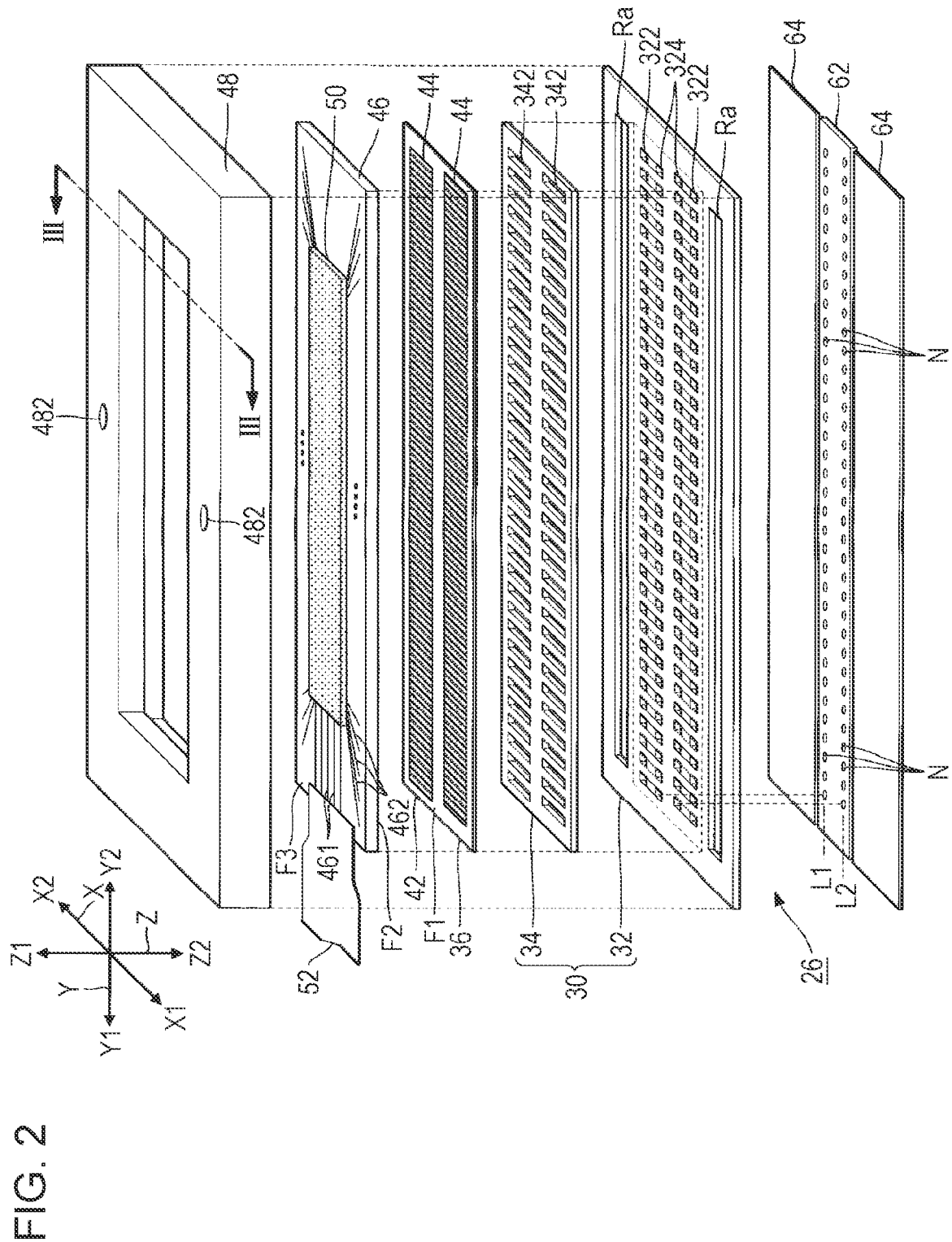
FIG. 2 is an exploded perspective view of a liquid ejection head according to the embodiment.
Figure 3:
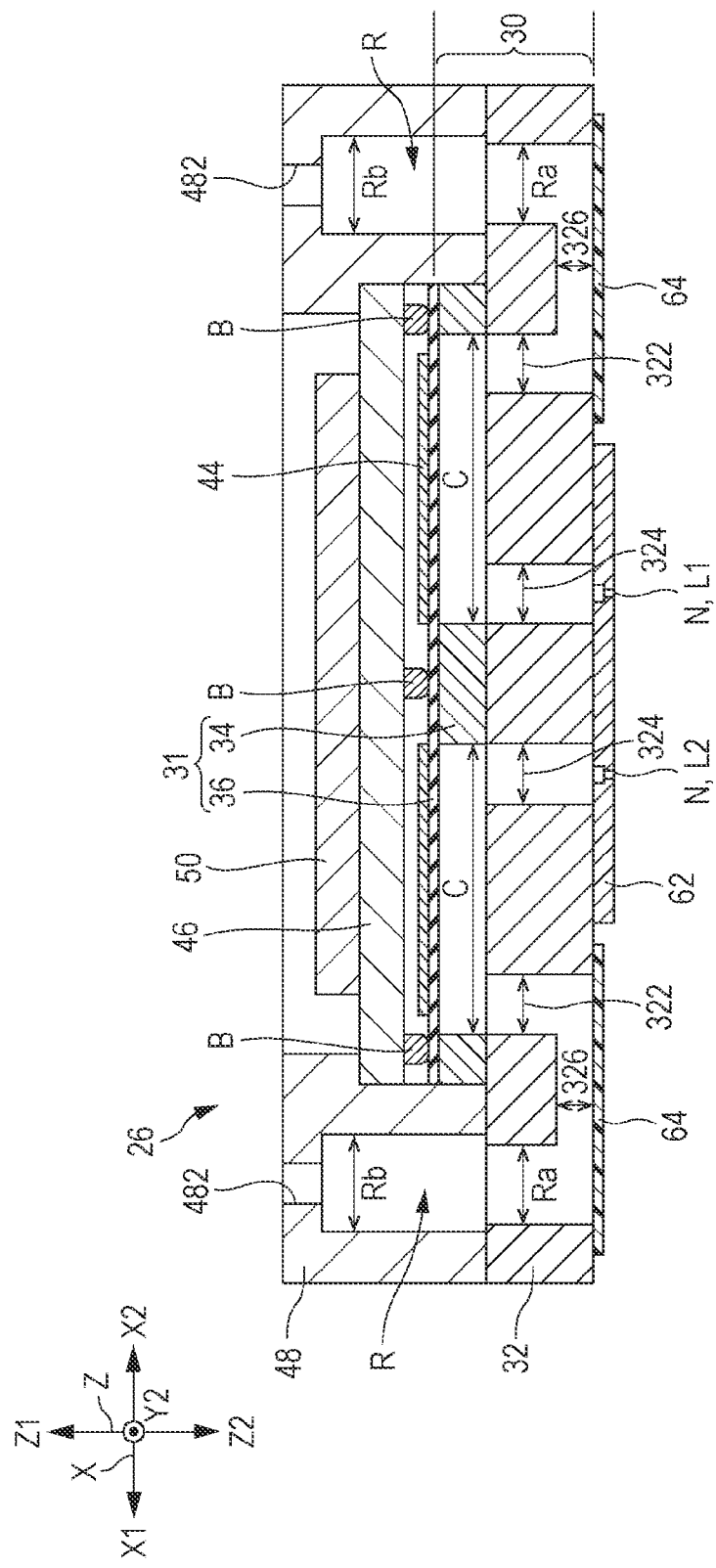
FIG. 3 is a cross-sectional view taken along the line III-III shown in FIG. 2.

FIG. 2 is an exploded perspective view of the liquid ejection head 26 according to the embodiment. FIG. 3 is a cross-sectional view taken along the line III-III shown in FIG. 2. As shown in FIG. 2, the liquid ejection head 26 has a plurality of nozzles N aligned in the direction along the Y axis. In the example shown in FIG. 2, the nozzles N are separated into a first line L1 and a second line L2 which are arranged in the direction along the X axis with a predetermined interval therebetween. The first line L1 and the second line L2 are each a group of nozzles N aligned in the direction along the Y axis. In this case, elements relating to the respective nozzles N of the first line L1 and elements relating to the respective nozzles N of the second line L2 in the liquid ejection head 26 have structures approximately symmetric to each other in the direction along the X axis.

However, the positions of the nozzles N in the first line L1 and the positions of the nozzles N in the second line L2 in the direction along the Y axis may or may not coincide with each other. In addition, the elements relating to the respective nozzles N of one of the first line L1 and the second line L2 may be omitted. Hereinafter, the structure in which the positions of the nozzles N in the first line L1 and the positions of the nozzles N in the second line L2 in the direction along the Y axis coincide with each other will be described by way of example.

As shown in FIGS. 2 and 3, the liquid ejection head 26 includes a flow path structural body 30, a nozzle plate 62, oscillation absorbing bodies 64, an oscillation plate 36, a wiring substrate 46, a housing portion 48, and a drive circuit 50.

The flow path structural body 30 is a structural body in which flow paths to supply the ink to the nozzles N are formed. The flow path structural body 30 of this embodiment includes a flow path substrate 32 and a pressure chamber substrate 34, and those substrates are laminated in this order in the Z1 direction. The flow path substrate 32 and the pressure chamber substrate 34 are each a long plate-shaped member extending in the direction along the Y axis. The flow path substrate 32 and the pressure chamber substrate 34 are bonded to each other with an adhesive or the like.

In a region located in the Z1 direction than the flow path structural body 30, the oscillation plate 36, the wiring substrate 46, the housing portion 48, and the drive circuit 50 are disposed. On the other hand, in a region located in the Z2 direction than the flow path structural body 30, the nozzle plate 62 and the oscillation absorbing bodies 64 are disposed. The elements of the liquid ejection head 26 are each a long plate-shaped member extending in the direction along the Y axis approximately similar to the flow path substrate 32 and the pressure chamber substrate 34 and are bonded to each other with an adhesive or the like.

The nozzle plate 62 is a plate-shaped member in which the nozzles N are formed. The nozzles N are each a circular through-hole through which the ink is allowed to pass. The nozzle plate 62 may be manufactured by processing a silicon single crystal substrate by a semiconductor manufacturing technology which uses processing techniques, such as dry etching or wet etching. However, in the manufacturing of the nozzle plate 62, other known methods and materials may also be appropriately used.

In the flow path substrate 32, a space Ra, supply flow paths 322, communication flow paths 324, and a supply liquid chamber 326 are formed for each of the first line L1 and the second line L2. The space Ra is a long opening extending in the direction along the Y axis in a plan view viewed in the direction along the Z axis. The supply flow path 322 and the communication flow path 324 are through-holes formed for each nozzle N. The supply liquid chamber 326 is a long space extending in the direction along the Y axis so as to be along the nozzles N and communicates the space Ra with the supply flow paths 322. The communication flow paths 324 are overlapped with nozzles N which correspond thereto in plan view.

The pressure chamber substrate 34 is a plate-shaped member in which pressure chambers C, each of which is called a cavity, are formed for each of the first line L1 and the second line L2. The pressure chambers C are aligned in the direction along the Y axis. The pressure chamber C is formed for each nozzle N and is a long space extending in the direction along the X axis in plan view. As is the case of the nozzle plate 62 described above, the flow path substrate 32 and the pressure chamber substrate 34 are each manufactured, for example, by processing a silicon single crystal substrate using a semiconductor manufacturing technology. However, for the manufacturing of each of the flow path substrate 32 and the pressure chamber substrate 34, other known methods and materials may also be appropriately used.

The pressure chamber C is a space located between the flow path substrate 32 and the oscillation plate 36. For each of the first line L1 and the second line L2, the pressure chambers C are aligned in the direction along the Y axis. In addition, the pressure chamber C communicates with the communication flow path 324 and the supply flow path 322. Hence, the pressure chamber C communicates with the nozzle N through the communication flow path 324 and also communicates with the space Ra through the supply flow path 322 and the supply liquid chamber 326.

On a surface of the pressure chamber substrate 34 facing in the Z1 direction, the oscillation plate 36 is disposed. The oscillation plate 36 is a plate-shaped member which can be elastically oscillated. In this case, a laminate 31 formed from the oscillation plate 36 and the pressure chamber substrate 34 is one example of a "substrate". In addition, the oscillation plate 36 may also be regarded as the "substrate". The oscillation plate 36 will be described later in detail.

On a surface of the oscillation plate 36 facing in the Z1 direction, piezoelectric elements 44 corresponding to the nozzles N are disposed for each of the first line L1 and the second line L2. The piezoelectric elements 44 are each a passive element which is deformed by a drive signal supply. The piezoelectric elements 44 each have a long shape extending in the direction along the X axis in plan view. The piezoelectric elements 44 are aligned in the direction along the Y axis so as to correspond to the pressure chambers C. In association with the deformation of the piezoelectric element 44, when the oscillation plate 36 is oscillated, the pressure in the pressure chamber C is changed, so that the ink is ejected from the nozzle N. The piezoelectric element 44 will be described later in detail.

The housing portion 48 is a case which stores the ink to be supplied into the pressure chambers C. As shown in FIG. 3, in the housing portion 48 of this embodiment, for each of the first line L1 and the second line L2, a space Rb is formed. The space Rb of the housing portion 48 and the space Ra of the flow path substrate 32 communicate with each other. A space formed by the space Ra and the space Rb functions as a liquid storage chamber (reservoir) R which stores the ink to be supplied into the pressure chambers C. In the liquid storage chamber R, the ink is supplied through an inlet port 482 formed in the housing portion 48. The ink in the liquid storage chamber R is supplied into the pressure chambers C through the supply liquid chamber 326 and the supply flow paths 322. The oscillation absorbing body 64 is a flexible film (compliance substrate) forming a wall surface of the liquid storage chamber R and absorbs the change in pressure of the ink therein.

The wiring substrate 46 is a plate-shaped member in which wires which electrically couple the drive circuit 50 to the piezoelectric elements 44 are formed. A surface of the wiring substrate 46 facing in the Z2 direction is bonded to the oscillation plate 36 with electrically conductive bumps B interposed therebetween. On the other hand, on a surface of the wiring substrate 46 facing in the Z1 direction, the drive circuit 50 is mounted. The drive circuit 50 is an integrated circuit (IC) chip which outputs a drive signal to drive each piezoelectric element 44 and a reference voltage.

To a surface of the wiring substrate 46 facing in the Z1 direction, an end portion of an external wire 52 is bonded. The external wire 52 is formed, for example, of a coupling component, such as a flexible printed circuit (FPC) or a flexible flat cable (FFC). In this case, in the wiring substrate 46, as shown in FIG. 2, there are formed wires 461 which electrically couple the external wire 52 and the drive circuit 50 and wires 462 to which the drive signal and the reference voltage to be output from the drive circuit 50 are supplied.

1-3. Details of Oscillation Plate and Piezoelectric Element

Figure 4:
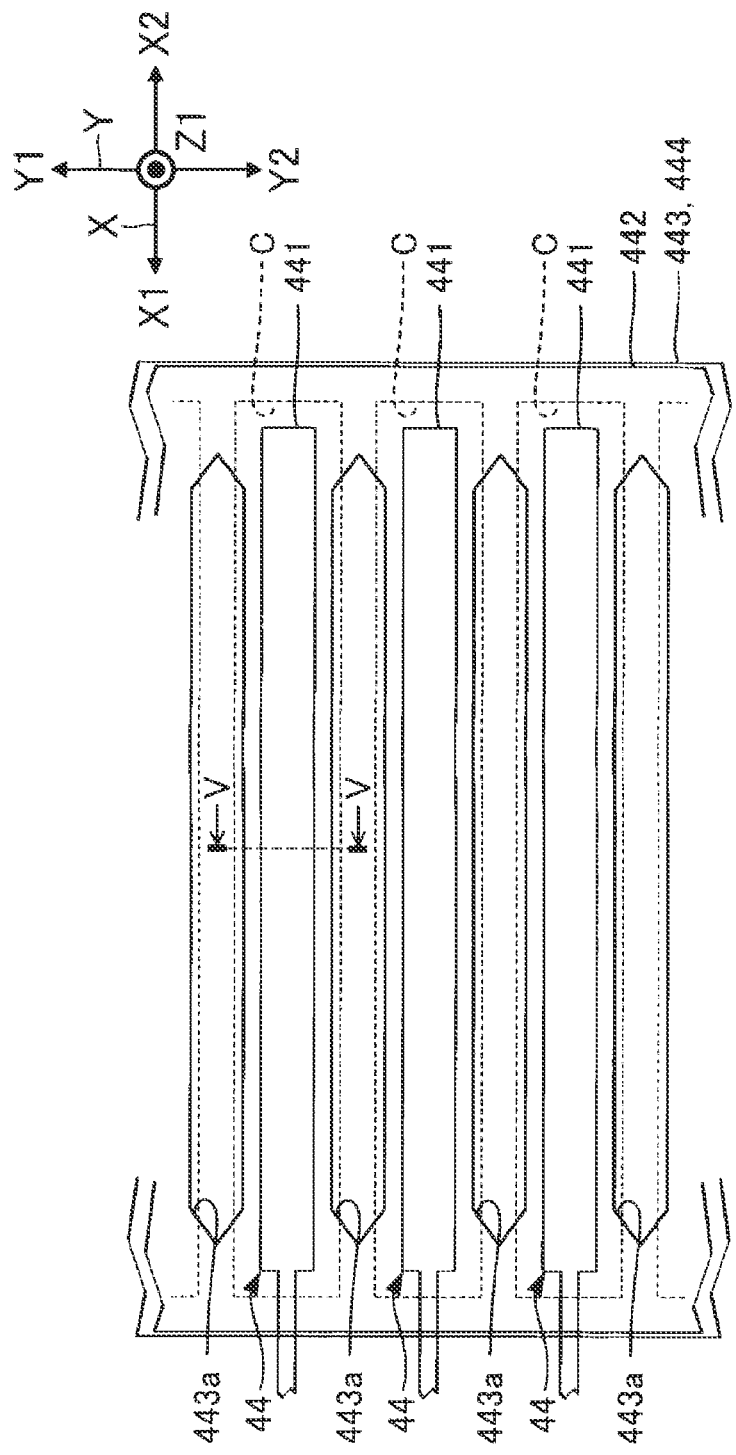
FIG. 4 is a plan view of piezoelectric elements according to the embodiment.
Figure 5:
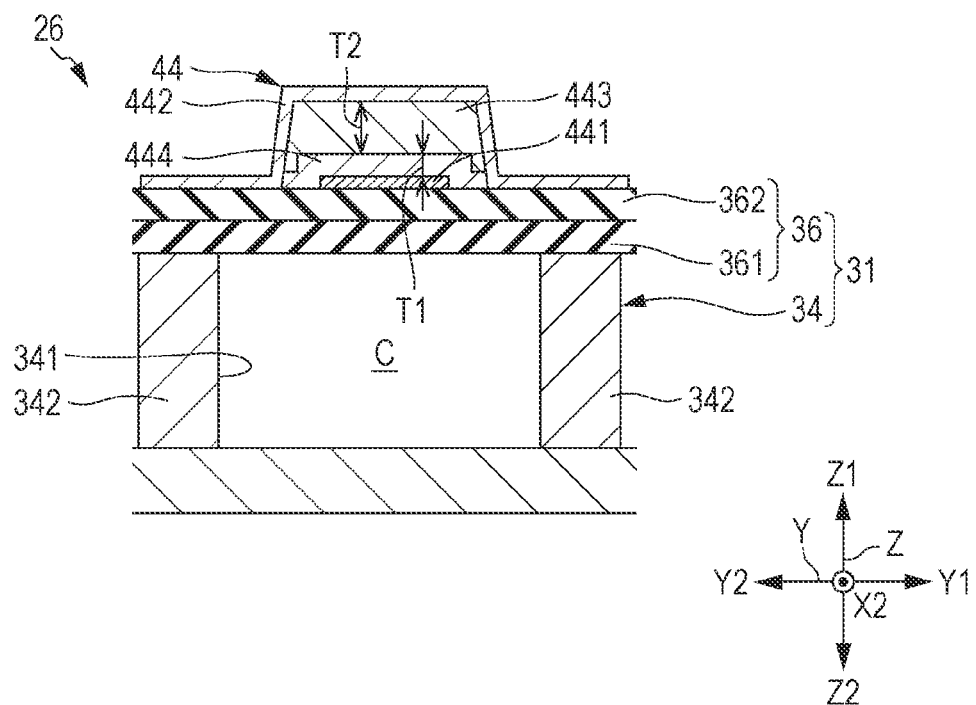
FIG. 5 is a cross-sectional view taken along the line V-V shown in FIG. 4.
Figure 6:
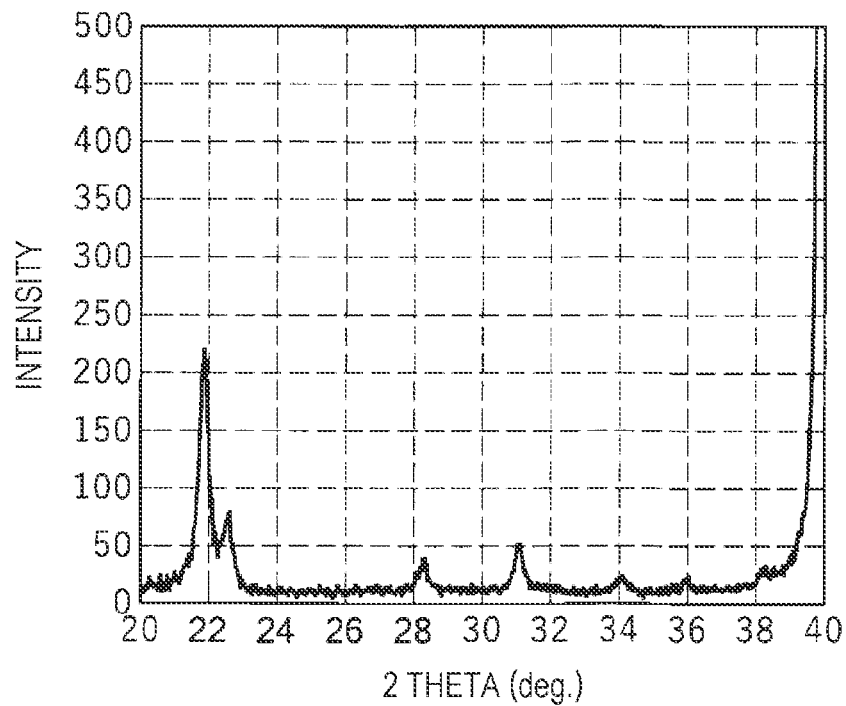
FIG. 6 is a view showing a measurement result of a piezoelectric layer of Example 1 by an X-ray diffraction method.
Figure 7:
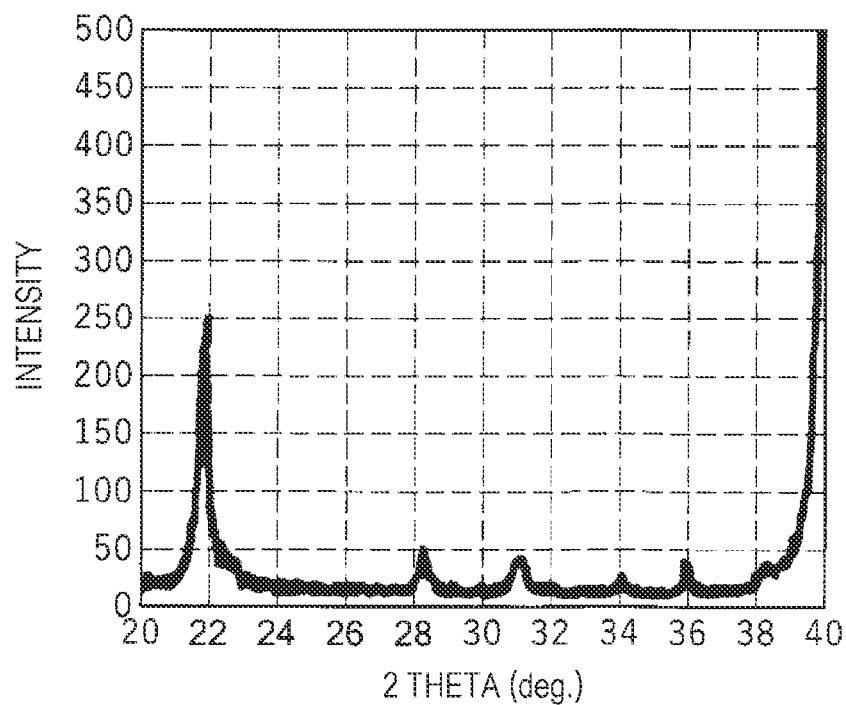
FIG. 7 is a view showing a measurement result of a piezoelectric layer of Example 2 by an X-ray diffraction method.
Figure 8:
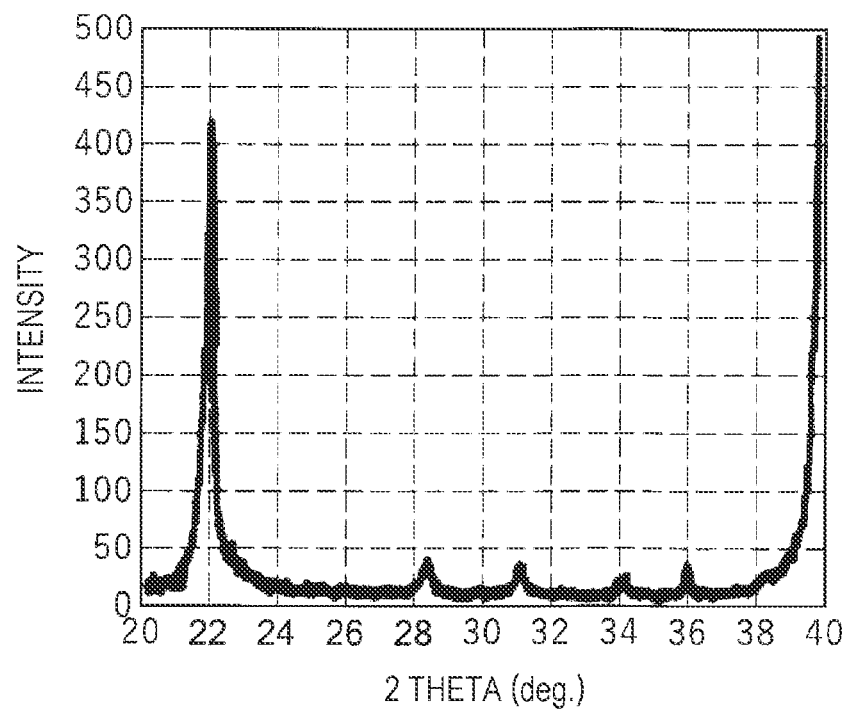
FIG. 8 is a view showing a measurement result of a piezoelectric layer of Example 3 by an X-ray diffraction method.
Figure 9:
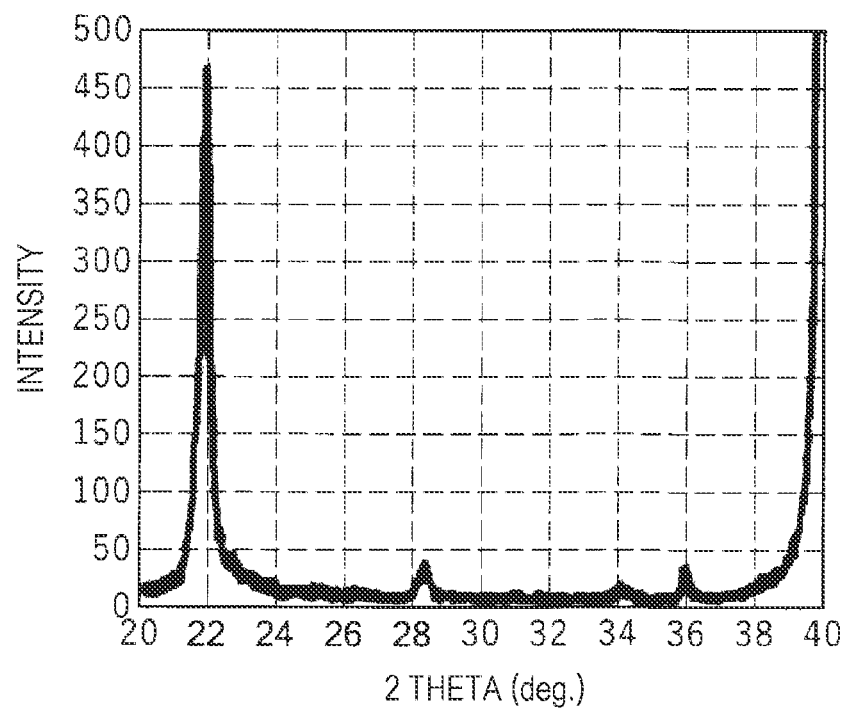
FIG. 9 is a view showing a measurement result of a piezoelectric layer of Example 4 by an X-ray diffraction method.
Figure 10:
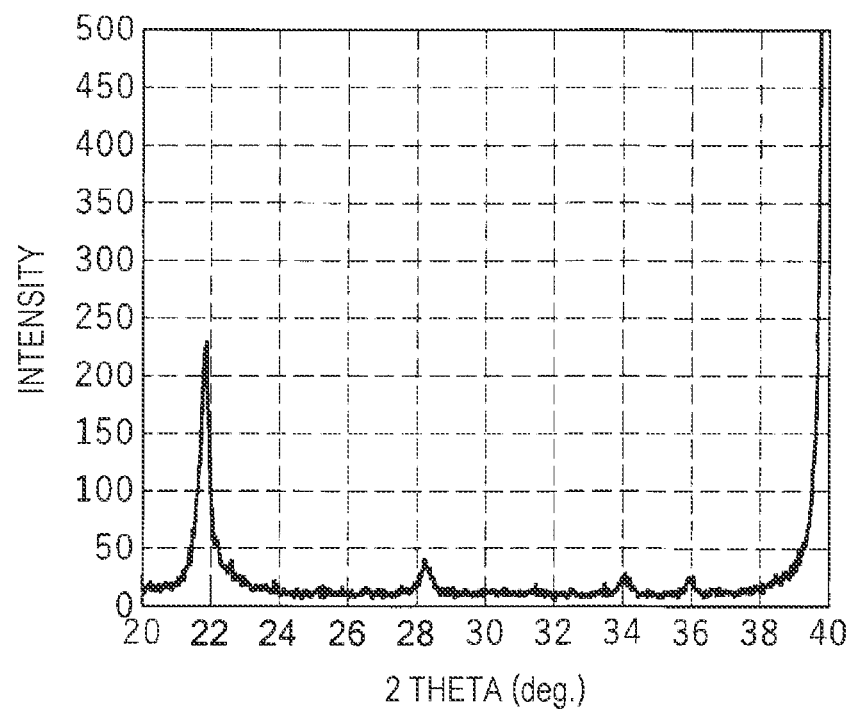
FIG. 10 is a view showing a measurement result of a piezoelectric layer of Example 5 by an X-ray diffraction method.
Figure 11:
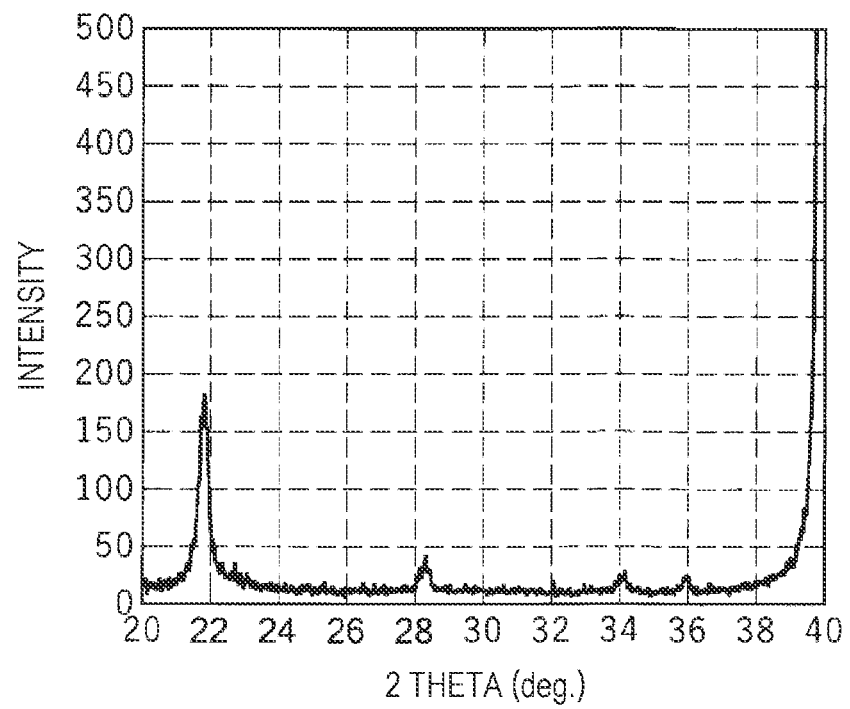
FIG. 11 is a view showing a measurement result of a piezoelectric layer of Example 6 by an X-ray diffraction method.
Figure 12:
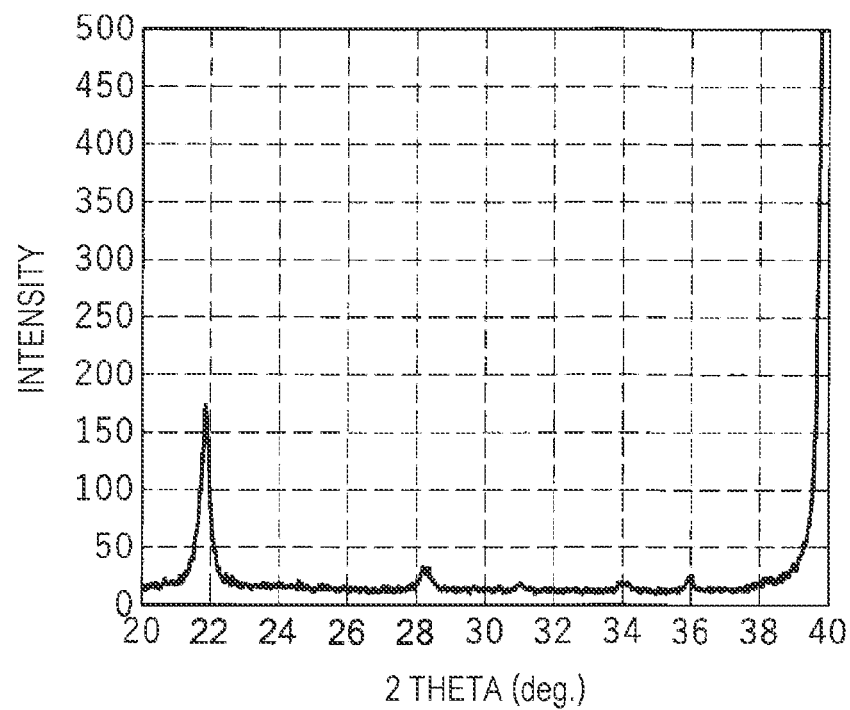
FIG. 12 is a view showing a measurement result of a piezoelectric layer of Example 7 by an X-ray diffraction method.
Figure 13:
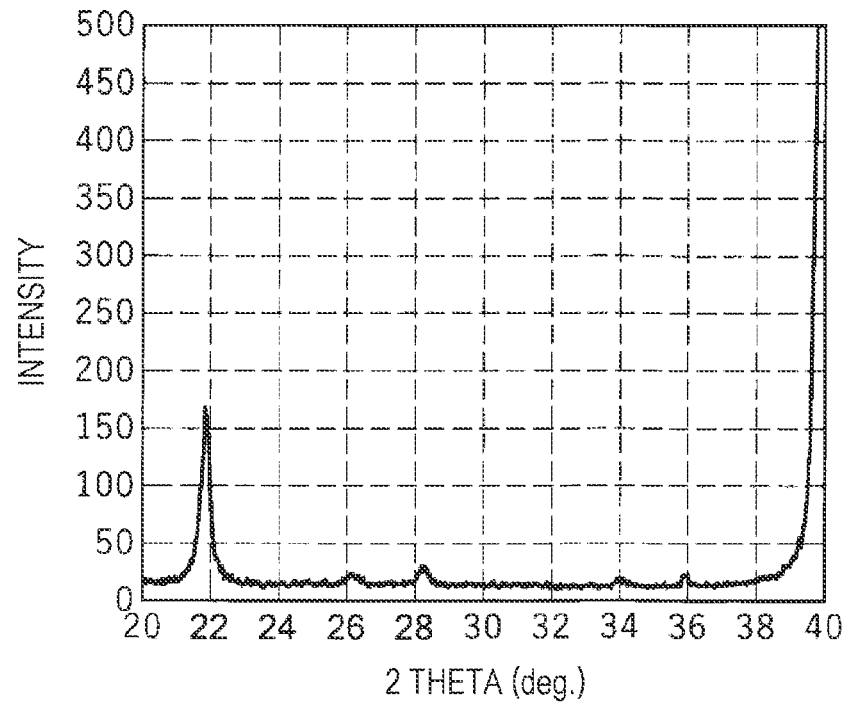
FIG. 13 is a view showing a measurement result of a piezoelectric layer of Example 8 by an X-ray diffraction method.
Figure 14:
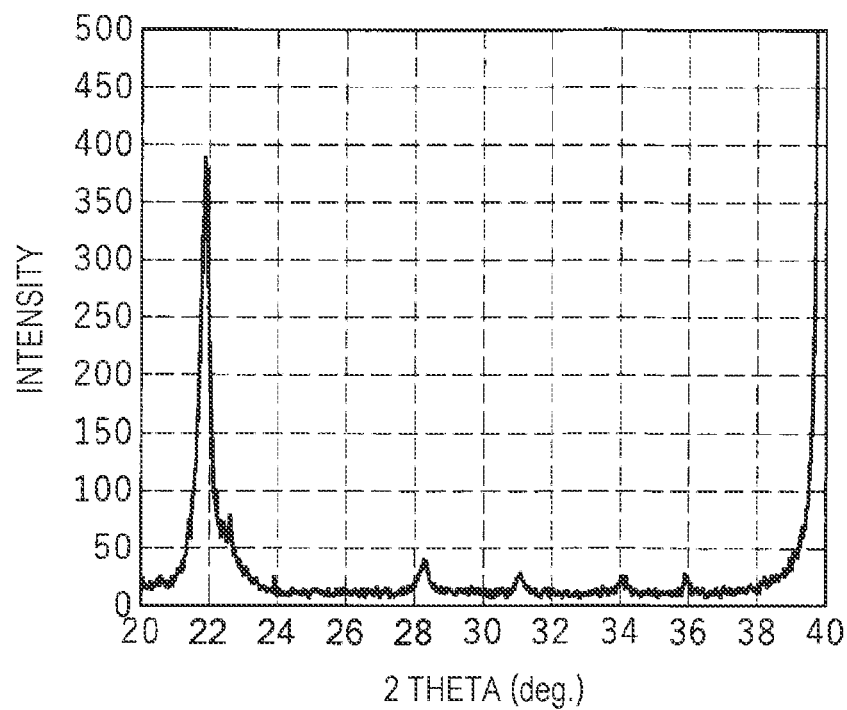
FIG. 14 is a view showing a measurement result of a piezoelectric layer of Example 9 by an X-ray diffraction method.
Figure 15:
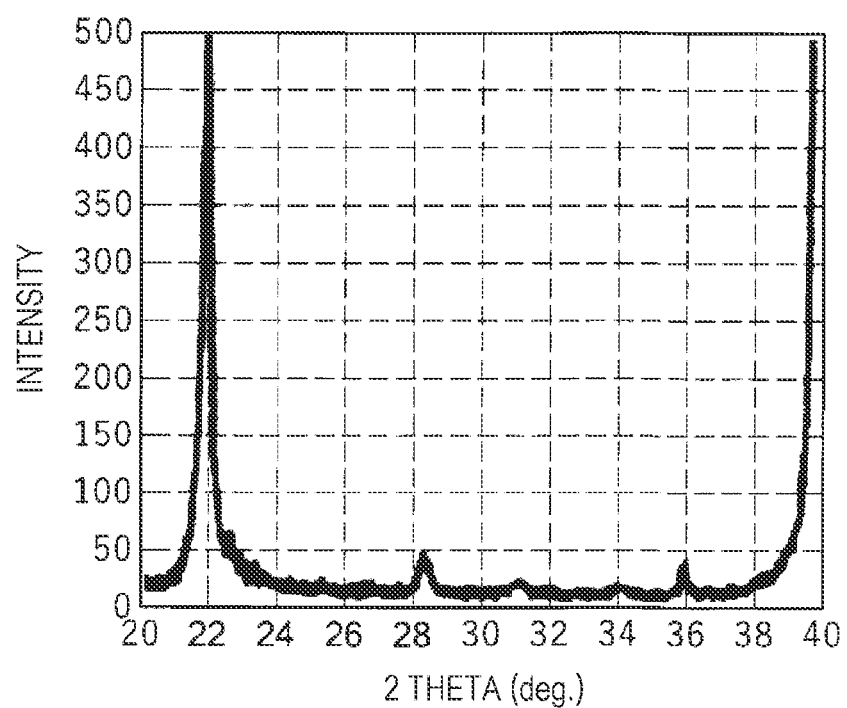
FIG. 15 is a view showing a measurement result of a piezoelectric layer of Example 10 by an X-ray diffraction method.
Figure 16:
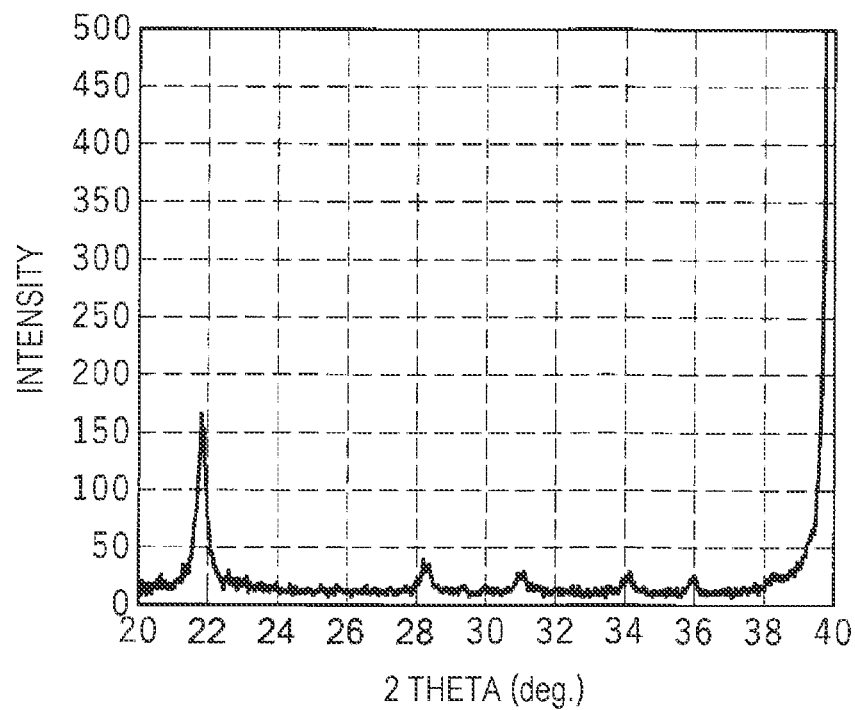
FIG. 16 is a view showing a measurement result of a piezoelectric layer of Example 11 by an X-ray diffraction method.
Figure 17:
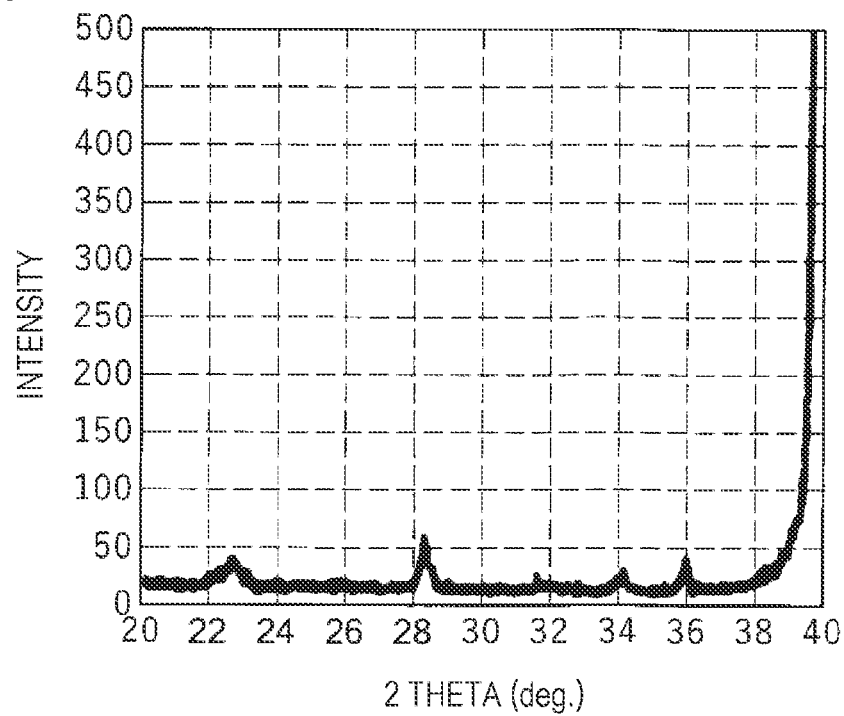
FIG. 17 is a view showing a measurement result of a piezoelectric layer of Comparative Example 1 by an X-ray diffraction method.
Figure 18:
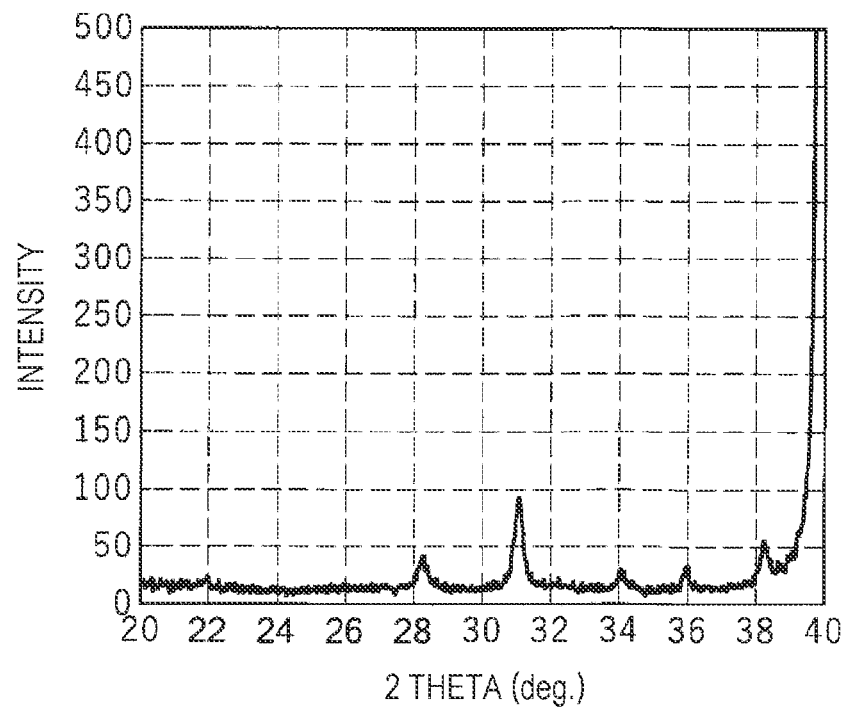
FIG. 18 is a view showing a measurement result of a piezoelectric layer of Comparative Example 2 by an X-ray diffraction method.
Figure 19:
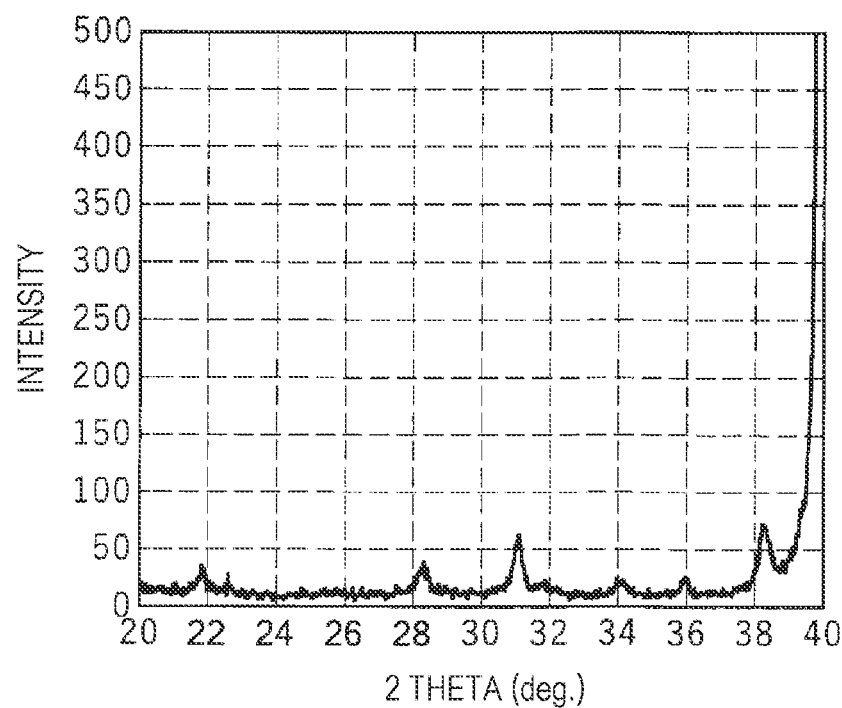
FIG. 19 is a view showing a measurement result of a piezoelectric layer of Comparative Example 3 by an X-ray diffraction method.
Figure 20:
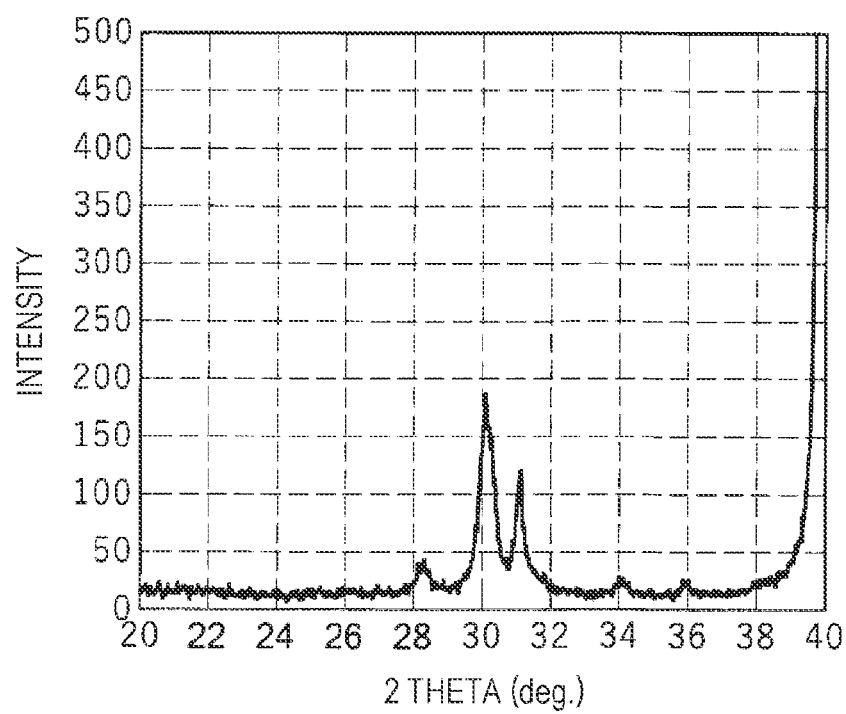
FIG. 20 is a view showing a measurement result of a piezoelectric layer of Comparative Example 4 by an X-ray diffraction method.

FIG. 4 is a plan view showing the piezoelectric elements 44 according to the embodiment. FIG. 5 is a cross-sectional view taken along the line V-V shown in FIG. 4. In the liquid ejection head 26, as shown in FIG. 5, the pressure chamber substrate 34, the oscillation plate 36, and the piezoelectric elements 44 are laminated in this order in the Z1 direction.

As shown in FIG. 5, in the pressure chamber substrate 34, a hole 341 forming the pressure chamber C is provided. Accordingly, in the pressure chamber substrate 34, between two holes 341 adjacent to each other, a wall-shaped partition 342 extending in the direction along the X axis is provided. In FIG. 4, a plan view shape of the hole 341 is shown by a dotted line. The pressure chamber substrate 34 is formed by anisotropic etching of a silicon single crystal substrate. As an etching solution for the anisotropic etching described above, for example, an aqueous potassium hydroxide (KOH) solution is used. In addition, in the above anisotropic etching, a first layer 361 which will be described later is used as an etching stop layer.

In addition, in FIG. 4, although being rectangular, the plan view shape of the hole 341 is not limited thereto and may be arbitrary. For example, the plan view shape of the hole 341 formed by anisotropic etching of a silicon single crystal substrate having a plane orientation (110) is a parallelogram.

As shown in FIG. 5, the oscillation plate 36 includes the first layer 361 and a second layer 362, and those layers are laminated in this order in the Z1 direction. The first layer 361 is an elastic film formed, for example, from silicon oxide ($SiO_2$). This elastic film is formed, for example, by thermal oxidation of one surface of a silicon single crystal substrate. The second layer 362 is an insulating film formed, for example, from zirconium oxide ($ZrO_2$). This insulating film is formed such that, for example, after a layer of zirconium is formed by a sputtering method, the layer is thermal-oxidized.

As described above, the second layer 362 of the oscillation plate 36 is formed from zirconium oxide, and the laminate 31 includes zirconium oxide. Zirconium oxide has excellent electrical insulating property, mechanical strength, and toughness. Hence, when the second layer 362 containing zirconium oxide is used for the oscillation plate 36, the characteristics of the oscillation plate 36 can be enhanced. In addition, even when a piezoelectric layer 443 which will be described later has a portion which is not provided on a seed layer 444 which will be described later, since the portion described above is disposed on the second layer 362, it is believed that when the piezoelectric layer 443 is formed, the portion described above is likely to be preferentially oriented in the (100) direction.

In addition, between the first layer 361 and the second layer 362, another layer formed of a metal oxide or the like may also be provided. In addition, a part or the entire of the oscillation plate 36 may be integrally formed using the same material as that of the pressure chamber substrate 34. In addition, the oscillation plate 36 may be formed from a single material layer.

As shown in FIG. 4, the piezoelectric element 44 is overlapped with the pressure chamber C in plan view. As shown in FIG. 5, the piezoelectric element 44 includes a first electrode 441, the seed layer 444, the piezoelectric layer 443, and a second electrode 442, and those described above are laminated in this order in the Z1 direction. Hence, in the piezoelectric element 44, on the laminate 31 which is one example of the substrate, the first electrode 441, the seed layer 444, the piezoelectric layer 443, and the second electrode 442 are laminated in this order. In addition, between the layers of the piezoelectric element 44 or between the piezoelectric element 44 and the oscillation plate 36, another layer, such as a layer which enhances the adhesion, may also be appropriately provided.

The first electrodes 441 are individual electrodes disposed separately from each other for the respective piezoelectric elements 44. In particular, the first electrodes 441 extending in the direction along the X axis are aligned in the direction along the Y axis with intervals therebetween. To the first electrode 441 of each piezoelectric element 44, a drive signal to eject the ink from a nozzle N corresponding to the piezoelectric element 44 is applied through the drive circuit 50.

The first electrode 441 is a layer formed, for example, from platinum (Pt). Platinum has excellent characteristics as an electrode material. Furthermore, since the first electrode 441 includes platinum, a seed layer 444 having a perovskite structure preferentially highly oriented in the (100) direction is estimated to be easily formed. The first electrode 441 may be formed by a known film forming technique, such as a sputtering method, and known processing techniques, such as photolithography and etching.

In addition, the constituent material of the first electrode 441 is not limited to platinum, and for example, a metal material, such as iridium (Ir), aluminum (Al), nickel (Ni), gold (Au), or copper (Cu), may also be used. In addition, the first electrode 441 may be formed from one metal material of those mentioned above or may be formed from at least two thereof in the form of a laminate, an alloy, or the like.

On the other hand, the second electrode 442 is a belt-shaped common electrode continuously extending in the direction along the Y axis so as to form the piezoelectric elements 44. To the second electrode 442, a predetermined reference voltage is applied.

The second electrode 442 is a layer formed, for example, from iridium (Ir). The second electrode 442 is formed, for example, by a known film forming technique, such as a sputtering method, and known processing techniques, such as photolithography and etching.

In addition, the constituent material of the second electrode 442 is not limited to iridium, and for example, a metal material, such as platinum (Pt), aluminum (Al), nickel (Ni), gold (Au), or copper (Cu), may also be used. In addition, the second electrode 442 may be formed from one metal material of those mentioned above or may be formed from at least two thereof in the form of a laminate, an alloy, or the like.

The piezoelectric layer 443 is disposed between the first electrode 441 and the second electrode 442. As shown in FIG. 4, the piezoelectric layer 443 has a belt shape continuously extending in the direction along the Y axis so as to form the piezoelectric elements 44. In the example shown in FIG. 4, in regions of the piezoelectric layer 443 each corresponding to a space between pressure chambers C adjacent to each other in plan view, through-holes 443a penetrating the piezoelectric layer 443 are formed to extend in the direction along the X axis. In addition, the piezoelectric layers 443 may also be provided for the respective piezoelectric elements 44.

The piezoelectric layer 443 is formed from a composite oxide having a perovskite structure containing as a constituent element, lead, zirconium, and titanium. As the composite oxide, for example, there may be mentioned lead titanate zirconate ($Pb(Zr,Ti)O_3$), lead lanthanum zirconate titanate (($Pb,La)(Zr,Ti)O_3$), lead niobate zirconium titanate ($Pb(Zr,Ti,Nb)O_3$), or lead magnesium niobate zirconium titanate (($Pb(Zr,Ti)(Mg,Nb)O_3$). Among those mentioned above, as the constituent material of the piezoelectric layer 443, lead titanate zirconate is preferably used. In addition, in the piezoelectric layer 443, a small amount of another element, such as an impurity, may also be contained.

The piezoelectric layer 443 may be formed such that, for example, after a precursor layer of a piezoelectric body is formed by a sol-gel method or a metal organic decomposition (MOD) method, the precursor layer is crystallized by firing.

The seed layer 444 is disposed between the first electrode 441 and the piezoelectric layer 443. As shown in FIG. 4, the seed layer 444 is formed over the same region as that of the piezoelectric layer 443 in plan view. In addition, as long as being disposed between the first electrode 441 and the piezoelectric layer 443, the seed layer 444 may also be provided in a region different from that of the piezoelectric layer 443 in plan view.

The seed layer 444 is formed from a composite oxide having a perovskite structure containing as a constituent element, lead, iron, and titanium. Since the piezoelectric layer 443 described above is provided on the seed layer 444 as described above, the composite oxide forming the piezoelectric layer 443 can be preferentially oriented in the (100) direction.

Incidentally, compared to the constituent elements of the orientation control layer described in JP-A-2004-66600, the constituent elements of the seed layer 444 are similar to the constituent elements of the piezoelectric layer 443. Hence, even when the constituent elements of the seed layer 444 are diffused to the piezoelectric layer 443, the effect thereof is not significant. As a result, the characteristics of the piezoelectric element 44 can be suppressed from being degraded.

In addition, since the specific dielectric constant of the composite oxide forming the seed layer 444 is high as compared to that of a metal element, such as titanium, degradation in displacement efficiency of the piezoelectric element 44 can be prevented, the degradation being caused by a layer which is formed from a metal element, such as titanium, having a low specific dielectric constant and which is present between the first electrode 441 and the second electrode 442.

The composite oxide contained in the seed layer 444 is, for example, a solid solution of $PbFeO_3$ and $PbTiO_3$ and is represented by Pb(Fe,Ti)O$_3$. In more particular, the composite oxide described above is represented by the following formula (1).

$$Pb_xFe_yTi_{(1-y)}O_z \qquad (1)$$

In addition, although x in the formula (1) may satisfy a relationship of 1.00≤x<2.00, in order to preferably obtain an effect to increase the degree of orientation of the piezoelectric layer 443 by the seed layer 444, a relationship of 1.00≤x<1.50 is preferably satisfied, and a relationship of 1.10≤x<1.40 is more preferably satisfied.

Although y in the formula (1) may satisfy a relationship of 0.10≤y≤0.90, in order to preferably obtain the effect to increase the degree of orientation of the piezoelectric layer 443 by the seed layer 444, a relationship of 0.20≤y≤0.80 is preferably satisfied, and a relationship of 0.40≤y≤0.60 is more preferably satisfied.

In addition, z in the formula (1) satisfies a relationship of z=3.00. However, z may not satisfy the relationship described above.

In order to preferably obtain the effect to increase the degree of (100) orientation of the piezoelectric layer 443 by the seed layer 444, x and y in the formula (1) satisfy preferably a relationship of 1.3≤(x/y)<13.0, more preferably a relationship of 1.5≤(x/y)<6.5, and further preferably a relationship of 1.6≤(x/y)<3.5.

In addition, as long as being a composite oxide having a perovskite structure containing as a constituent element, lead, iron, and titanium, the constituent material of the seed layer 444 is not limited to the composite oxide represented by the above formula (1) and may also contain as a constituent element, an element other than lead, iron, and titanium. In addition, in the seed layer 444, a small amount of another element, such as an impurity, may also be contained.

The specific dielectric constant of the seed layer 444 as described above is 100 F·m$^{-1}$ or more. Hence, as described above, a piezoelectric element 44 having an excellent displacement efficiency can be realized.

In addition, when the piezoelectric layer 443 as described above is analyzed by an x-ray diffraction analysis, a peak intensity corresponding to the (100) is higher than a peak intensity corresponding to the (110). That is, the degree of (100) orientation is higher than the degree of (110) orientation. Hence, a piezoelectric element 44 having an excellent displacement efficiency can be realized.

As long as being capable of increasing the degree of orientation of the (100) direction of the piezoelectric layer 443, although a thickness T1 of the seed layer 444 is not particularly limited, the thickness T1 is preferably smaller than a thickness T2 of the piezoelectric layer 443. In the case described above, compared to the case in which the thickness T1 of the seed layer 444 is larger than the thickness T2 of the piezoelectric layer 443, the displacement efficiency of the piezoelectric element 44 can be increased.

In addition, the thickness T1 of the seed layer 444 is preferably in a range of 20 to 200 nm, more preferably in a range of 50 to 150 nm, and further preferably in a range of 70 to 130 nm. Since the thickness T1 of the seed layer 444 is in the range described above, while the displacement efficiency of the piezoelectric element 44 is increased, by using the seed layer 444, the composite oxide forming the piezoelectric layer 443 can be preferentially oriented in the (100) direction.

On the other hand, when the thickness T1 of the seed layer 444 is excessively small, the effect to increase the degree of orientation of the piezoelectric layer 443 by the seed layer 444 tends to be degraded. In addition, when the thickness T1 of the seed layer 444 is excessively large, an improvement of the effect to increase the degree of (100) orientation of the piezoelectric layer 443 by the seed layer 444 may not be expected, and in addition, depending on the thickness T2 of the piezoelectric layer 443, the displacement efficiency of the piezoelectric element 44 may also tend to be degraded.

2. Modified Examples

The embodiment described above by way of example may be variously changed and/or modified. Concrete modified modes to be applied to the above embodiment will be described by way of example. In addition, at least two modes arbitrarily selected from the following examples may be appropriately used in combination with each other as long as no contradiction occurs therebetween.

2-1. Modified Example 1

In the above embodiment, the liquid ejection head 26 including the piezoelectric elements 44 and the drive circuit 50 which drives the piezoelectric elements 44 has been described by way of example. An apparatus or the like mounting the piezoelectric element 44 is not limited to a liquid ejection head, and for example, another drive device, such as a piezoelectric actuator, including at least one piezoelectric element, and a detection device, such as a pressure sensor, including at least one piezoelectric element, may also be mentioned.

2-2. Modified Example 2

In the embodiment described above, the liquid ejection head 26 includes the piezoelectric elements 44 which are aligned. In this case, the piezoelectric elements 44 include the first electrodes 441 provided for the respective piezoelectric elements 44 and the second electrode 442 commonly provided for the piezoelectric elements 44. The first electrodes 441 are disposed between the piezoelectric layer 443 and the oscillation plate 36.

As described above, in the embodiment described above, although the structure in which the first electrodes 441 are individual electrodes and in which the second electrode 442 is a common electrode has been describe by way of example, the first electrode 441 may be a continuous common electrode to form the piezoelectric elements 44, and the second electrodes 442 may be individual electrodes of the respective piezoelectric elements 44. Alternatively, both of the first electrodes 441 and the second electrodes 442 may be individual electrodes.

2-3. Modified Example 3

In the embodiment described above, although the serial type liquid ejection apparatus 100 in which the transport body 242 mounting the liquid ejection head 26 is reciprocally transferred has been described by way of example, the present disclosure may also be applied to a line type liquid ejection apparatus in which the nozzles N are provided over the entire width of the medium 12.

2-4. Modified Example 4

The liquid ejection apparatus 100 described in the above embodiment may be applied to, besides an apparatus exclusively used for printing, various types of apparatuses, such as a facsimile apparatus and a copying machine. In addition, the application of the liquid ejection apparatus of the present disclosure is not limited to printing. For example, a liquid ejection apparatus which ejects solutions of colorants may be used as a manufacturing apparatus which forms a color filter of a liquid crystal display apparatus. In addition, a liquid ejection apparatus which ejects a solution of an electrically conductive material may be used as a manufacturing apparatus which forms wires and/or electrodes of a wiring substrate.

2-5. Modified Example 5

In the embodiment described above, although the structure in which the piezoelectric layer includes a composite oxide having a perovskite structure containing as a constituent element, lead, zirconium, and titanium has been described by way of example, the present disclosure is not limited to the structure described above. For example, as the piezoelectric layer, a composite oxide, such as barium titanate ($BaTiO_3$) or potassium sodium niobate (($K,Na$)$NbO_3$), may also be used.

2-6. Modified Example 6

In the embodiment described above, although the structure in which the composite oxide of the seed layer has a perovskite structure has been described by way of example, the present disclosure is not limited to the structure described above. As long as being a composite oxide containing as a constituent element, lead, iron, and titanium, the composite oxide of the seed layer is not always required to have a perovskite structure.

Examples

Hereinafter, concrete examples of the present disclosure will be described. In addition, the present disclosure is not limited to the following examples.

A. Manufacturing of Piezoelectric Layer

A-1. Example 1

First, one surface of a silicon single crystal substrate having a plane orientation (110) was thermal-oxidized, so that a silicon dioxide film having a thickness of 1,460 nm was formed as a first layer of an oscillation plate.

Next, on the silicon dioxide film described above, a zirconium film was formed by a sputtering method and then thermal-oxidized at 900° C., so that a zirconium oxide film having a thickness of 400 nm was formed as a second layer of the oscillation plate.

On the zirconium oxide film described above, in a heated environment at 450° C., a film was formed from platinum by a sputtering method, so that a first electrode having a thickness of 50 nm was formed.

Subsequently, after an MOD solution was prepared using respective MOD solutions of lead, iron, and titanium to have a Pb:Fe:Ti ratio of 1.3:0.1:0.9 and was then applied on the first electrode, drying and degreasing were performed at 380° C., and a heat treatment was further performed by a rapid thermal annealing (RTA) at 750° C. for 3 minutes, so that a seed layer having a thickness of 50 nm was formed to have a composition of $Pb_{1.3}Fe_{0.1}Ti_{0.9}O_z$. Accordingly, x=1.3, y=0.1, and x/y=13.0 were satisfied.

Next, after an MOD solution prepared to have a Pb:Zr:Ti ratio of 1.18:0.52:0.48 was applied on the seed layer by a spin coating method, drying at 180° C. and degreasing at 440° C. were performed, and a heat treatment was then performed at 750° C. for 5 minutes by an RTA, so that a piezoelectric layer having a thickness of 1,000 nm was formed to have a PZT structure.

A-2. Example 2

Except for that the seed layer was formed using an MOD solution prepared to have a Pb:Fe:Ti ratio of 1.3:0.2:0.8, a piezoelectric layer of Example 2 was formed in a manner similar to that of Example 1 described above. Accordingly, x=1.3, y=0.2, and x/y=6.5 were satisfied.

A-3. Example 3

Except for that the seed layer was formed using an MOD solution prepared to have a Pb:Fe:Ti ratio of 1.3:0.3:0.7, a piezoelectric layer of Example 3 was formed in a manner similar to that of Example 1 described above. Accordingly, x=1.3, y=0.3, and x/y=4.3 were satisfied.

A-4. Example 4

Except for that the seed layer was formed using an MOD solution prepared to have a Pb:Fe:Ti ratio of 1.3:0.4:0.6, a piezoelectric layer of Example 4 was formed in a manner similar to that of Example 1 described above. Accordingly, x=1.3, y=0.4, and x/y=3.3 were satisfied.

A-5. Example 5

Except for that the seed layer was formed using an MOD solution prepared to have a Pb:Fe:Ti ratio of 1.3:0.5:0.5, a piezoelectric layer of Example 5 was formed in a manner similar to that of Example 1 described above. Accordingly, x=1.3, y=0.5, and x/y=2.6 were satisfied.

A-6. Example 6

Except for that the seed layer was formed using an MOD solution prepared to have a Pb:Fe:Ti ratio of 1.3:0.6:0.4, a piezoelectric layer of Example 6 was formed in a manner similar to that of Example 1 described above. Accordingly, x=1.3, y=0.6, and x/y=2.2 were satisfied.

A-7. Example 7

Except for that the seed layer was formed using an MOD solution prepared to have a Pb:Fe:Ti ratio of 1.3:0.8:0.2, a piezoelectric layer of Example 7 was formed in a manner similar to that of Example 1 described above. Accordingly, x=1.3, y=0.8, and x/y=1.6 were satisfied.

A-8. Example 8

Except for that the seed layer was formed using an MOD solution prepared to have a Pb:Fe:Ti ratio of 1.3:0.9:0.1, a piezoelectric layer of Example 8 was formed in a manner similar to that of Example 1 described above. Accordingly, x=1.3, y=0.9, and x/y=1.4 were satisfied.

A-9. Example 9

Except for that the seed layer was formed using an MOD solution prepared to have a Pb:Fe:Ti ratio of 1.1:0.3:0.7, a piezoelectric layer of Example 9 was formed in a manner similar to that of Example 1 described above. Accordingly, x=1.1, y=0.3, and x/y=3.7 were satisfied.

A-10. Example 10

Except for that the seed layer was formed using an MOD solution prepared to have a Pb:Fe:Ti ratio of 1.1:0.4:0.6, a piezoelectric layer of Example 10 was formed in a manner similar to that of Example 1 described above. Accordingly, x=1.1, y=0.4, and x/y=2.8 were satisfied.

A-11. Example 11

Except for that the seed layer was formed using an MOD solution prepared to have a Pb:Fe:Ti ratio of 1.1:0.6:0.4, a piezoelectric layer of Example 11 was formed in a manner similar to that of Example 1 described above. Accordingly, x=1.1, y=0.6, and x/y=1.8 were satisfied.

A-12. Example 12

Except for that the thickness of the seed layer was changed to 20 nm, a piezoelectric layer of Example 12 was formed in a manner similar to that of Example 1 described above.

A-13. Example 13

Except for that the thickness of the seed layer was changed to 200 nm, a piezoelectric layer of Example 13 was formed in a manner similar to that of Example 1 described above.

A-14. Comparative Example 1

Except for that by an MOD solution having a Pb:Ti ratio of 1.3:1.0 which was prepared using MOD solutions of lead and titanium, the seed layer was formed, a piezoelectric layer of Comparative Example 1 was formed in a manner similar to that of Example 1 described above.

A-15. Comparative Example 2

Except for that by an MOD solution having a Pb:Fe ratio of 1.3:1.0 which was prepared using MOD solutions of lead and iron, the seed layer was formed, a piezoelectric layer of Comparative Example 2 was formed in a manner similar to that of Example 1 described above.

A-16. Comparative Example 3

Except for that by an MOD solution prepared to have a Pb:Fe:Ti ratio of 1.1:0.1:0.9, the seed layer was formed, a piezoelectric layer of Comparative Example 3 was formed in a manner similar to that of Example 1 described above.

A-17. Comparative Example 4

Except for that by an MOD solution having a Pb:Co:Ti ratio of 1.3:0.4:0.6 which was prepared using MOD solutions of lead, cobalt, and titanium, the seed layer was formed, a piezoelectric layer of Comparative Example 4 was formed in a manner similar to that of Example 1 described above.

B. Evaluation

The orientation state of the piezoelectric layer of each of Examples and Comparative Examples was investigated using an X-ray diffraction apparatus (DISCOVER with GADDS, manufactured by Bruker).

In this investigation, the measurement using the above X-ray diffraction apparatus was performed under the following condition.
tube voltage: 50 kV
tube current: 100 mA
detector distance: 15 cm
collimator diameter: 0.1 mm
measurement time: 180 seconds
ψ=0°

The two dimensional data obtained from this measurement was converted into an X-ray diffraction intensity curve with a 2θ range of 20° to 40°, an x range of −95° to −85°, a step width of 0.02°, and intensity normalization method: Bin normalized. The results are shown in FIGS. 6 to 20. In addition, although the results of Examples 12 and 13 are now shown, it was confirmed that results each similar to that of Example 1 could be obtained by a different experiment performed by the inventor.

As shown in FIGS. 6 to 16, in each Example, although the (110) peak and the (111) peak of PZT are slightly observed at approximately 32° and 38°, respectively, the (100) peak of PZT observed at 22° is significantly strong. The reason for this is believed that when the piezoelectric layer is formed, the crystal orientation of the piezoelectric layer is influenced by the crystal orientation of the seed layer.

On the other hand, as shown in FIGS. 17 to 20, in each Comparative Example, the (100) peak of PZT is hardly observed or is very weak, and the (110) peak and the (111) peak of PZT are strong as compared to that of each Example. In this case, the reason the (100) peak of PZT of each Comparative Example is very weak is believed that since the (100) orientation of the seed layer is weak, the (100) peak of PZT is not influenced thereby, and the contribution of the (110) orientation which is likely to be formed in PZT and the contribution of the (111) orientation also formed in PZT by the influence of the (111) orientation of Pt or the like contained in the first electrode 441 are increased.

The results described above are evaluated by four stages of A, B, C, and D. In addition, among A, B, C, and D, A is best, and B, C, and D are inferior in this order.

TABLE 1

| | SEED LAYER | | |
|---|---|---|---|
| | COMPOSITION | THICKNESS [nm] | EVALUATION |
| EXAMPLE 1 | $Pb_{1.3}Fe_{0.1}Ti_{0.9}O_z$ | 50 | C |
| EXAMPLE 2 | $Pb_{1.3}Fe_{0.2}Ti_{0.8}O_z$ | 50 | B |
| EXAMPLE 3 | $Pb_{1.3}Fe_{0.3}Ti_{0.7}O_z$ | 50 | B |
| EXAMPLE 4 | $Pb_{1.3}Fe_{0.4}Ti_{0.6}O_z$ | 50 | A |
| EXAMPLE 5 | $Pb_{1.3}Fe_{0.5}Ti_{0.5}O_z$ | 50 | A |
| EXAMPLE 6 | $Pb_{1.3}Fe_{0.6}Ti_{0.4}O_z$ | 50 | A |
| EXAMPLE 7 | $Pb_{1.3}Fe_{0.8}Ti_{0.2}O_z$ | 50 | A |
| EXAMPLE 8 | $Pb_{1.3}Fe_{0.9}Ti_{0.1}O_z$ | 50 | C |
| EXAMPLE 9 | $Pb_{1.1}Fe_{0.3}Ti_{0.7}O_z$ | 50 | C |
| EXAMPLE 10 | $Pb_{1.1}Fe_{0.4}Ti_{0.6}O_z$ | 50 | A |
| EXAMPLE 11 | $Pb_{1.1}Fe_{0.6}Ti_{0.4}O_z$ | 50 | B |
| EXAMPLE 12 | $Pb_{1.3}Fe_{0.1}Ti_{0.9}O_z$ | 20 | C |
| EXAMPLE 13 | $Pb_{1.3}Fe_{0.1}Ti_{0.9}O_z$ | 200 | C |
| COMPARATIVE EXAMPLE 1 | $Pb_{1.3}Ti_{1.0}O_z$ | 50 | D |
| COMPARATIVE EXAMPLE 2 | $Pb_{1.3}Fe_{1.0}O_z$ | 50 | D |
| COMPARATIVE EXAMPLE 3 | $Pb_{1.1}Fe_{0.1}Ti_{0.9}O_z$ | 50 | D |
| COMPARATIVE EXAMPLE 4 | $Pb_{1.3}Co_{0.4}Ti_{0.6}O_z$ | 50 | D |

What is claimed is:

1. A piezoelectric element comprising:
a substrate; and
a laminate which is provided on the substrate, and which includes a first electrode, a seed layer, a piezoelectric layer, and a second electrode in this order,
wherein the seed layer is a composite oxide,
wherein a metal of the composite oxide is selected from the group consisting of lead, iron, and titanium, and
wherein the composite oxide of the seed layer has a perovskite structure.

2. The piezoelectric element according to claim 1,
wherein the composite oxide included in the seed layer is represented by the following formula (1)

$$Pb_xFe_yTi_{(1-y)}O_z \qquad (1)$$

wherein $1.00 \leq x < 2.00$ is satisfied.

3. The piezoelectric element according to claim 1,
wherein the composite oxide of the seed layer is represented by the following formula (1)

$$Pb_xFe_yTi_{(1-y)}O_z \qquad (1)$$

wherein $0.20 \leq y \leq 0.80$ is satisfied.

4. The piezoelectric element according to claim 1,
wherein the composite oxide of the seed layer is represented by the following formula (1)

$$Pb_xFe_yTi_{(1-y)}O_z \qquad (1)$$

wherein $1.3 \leq (x/y) < 13.0$ is satisfied.

5. The piezoelectric element according to claim 1,
wherein the first electrode includes platinum.

6. The piezoelectric element according to claim 1,
wherein the substrate includes zirconium oxide.

7. The piezoelectric element according to claim 1,
wherein the seed layer has a thickness smaller than that of the piezoelectric layer.

8. The piezoelectric element according to claim 1,
wherein the seed layer has a thickness of 20 to 200 nm.

9. The piezoelectric element according to claim 1,
wherein the seed layer has a specific dielectric constant of 100 $F \cdot m^{-1}$ or more.

10. The piezoelectric element according to claim 1,
wherein according to an analysis using an x-ray diffraction method, the piezoelectric layer has a degree of (100) orientation higher than a degree of (110) orientation.

11. The piezoelectric element according to claim 1,
wherein the piezoelectric layer includes a composite oxide having a perovskite structure which contains as a constituent element, lead, zirconium, and titanium.

12. A liquid ejection head comprising:
piezoelectric element according to claim 1; and
a drive circuit to drive the piezoelectric element.

13. The liquid ejection head according to claim 12,
wherein the piezoelectric elements are aligned,
the first electrodes are individually provided for the piezoelectric elements, and
the second electrodes are commonly provided for the piezoelectric elements.

14. The liquid ejection head according to claim 12,
wherein the piezoelectric elements are aligned,
the first electrodes are commonly provided for the piezoelectric elements, and
the second electrodes are individually provided for the piezoelectric elements.

15. A liquid ejection apparatus comprising:
the liquid ejection head according to claim 12, and
a control portion which controls an operation of the liquid ejection head.

16. The piezoelectric element according to claim 1,
wherein the seed layer is in contact with each of the first electrode, the piezoelectric layer and the second electrode.

17. A piezoelectric element comprising:
a substrate; and
a laminate which is provided on the substrate, and which includes a first electrode, a seed layer, a piezoelectric layer, and a second electrode in this order,
wherein the seed layer is a composite oxide,
wherein a metal of the composite oxide is selected from the group consisting of lead, iron, and titanium, and
wherein the composite oxide of the seed layer is represented by the following formula (1)

$$Pb_xFe_yTi_{(1-y)}O_z \qquad (1)$$

wherein $0.20 \leq y \leq 0.80$ is satisfied.

18. A piezoelectric element comprising:
a substrate; and
a laminate which is provided on the substrate, and which includes a first electrode, a seed layer, a piezoelectric layer, and a second electrode in this order,
wherein the seed layer is a composite oxide,
wherein a metal of the composite oxide is selected from the group consisting of lead, iron, and titanium, and
wherein the seed layer is in contact with each of the first electrode, the piezoelectric layer and the second electrode.

* * * * *